(12) United States Patent
Carvalho et al.

(10) Patent No.: US 10,911,164 B2
(45) Date of Patent: Feb. 2, 2021

(54) APPARATUS AND METHODS FOR CALIBRATING ANALOG CIRCUITRY IN AN INTEGRATED CIRCUIT

(71) Applicant: Altera Corporation, San Jose, CA (US)

(72) Inventors: Neville Carvalho, Saratoga, CA (US); Tim Tri Hoang, San Jose, CA (US); Sergey Shumarayev, Los Altos Hills, CA (US)

(73) Assignee: Altera Corporation, San Jose, CA (US)

( * ) Notice: Subject to any disclaimer, the term of this patent is extended or adjusted under 35 U.S.C. 154(b) by 312 days.

(21) Appl. No.: 16/140,292

(22) Filed: Sep. 24, 2018

(65) Prior Publication Data

US 2019/0028213 A1    Jan. 24, 2019

Related U.S. Application Data

(62) Division of application No. 13/446,555, filed on Apr. 13, 2012, now Pat. No. 10,110,328.

(51) Int. Cl.
*H04B 17/21* (2015.01)
*H04B 17/11* (2015.01)
*G01R 35/00* (2006.01)
*G12B 13/00* (2006.01)

(52) U.S. Cl.
CPC ............ *H04B 17/21* (2015.01); *G01R 35/00* (2013.01); *G01R 35/005* (2013.01); *G12B 13/00* (2013.01); *H04B 17/11* (2015.01)

(58) Field of Classification Search
USPC ........................................................ 702/107
See application file for complete search history.

(56) References Cited

U.S. PATENT DOCUMENTS

| | | | | |
|---|---|---|---|---|
| 5,574,915 A | * | 11/1996 | Lemon | G06F 9/4411 712/220 |
| 5,760,720 A | | 6/1998 | Nolan et al. | |
| 5,918,195 A | * | 6/1999 | Halgrimson | A01B 63/00 318/624 |
| 6,226,562 B1 | | 5/2001 | Philpott | |

(Continued)

FOREIGN PATENT DOCUMENTS

WO    2005111640 A1    11/2005

OTHER PUBLICATIONS

ALTERA—Avalon Memory-Mapped Interface Specification, May 2007, pp. 9-14.

(Continued)

*Primary Examiner* — Paul D Lee (57) ABSTRACT

The present disclosure provides apparatus and methods for the calibration of analog circuitry on an integrated circuit. One embodiment relates to a method of calibrating analog circuitry within an integrated circuit. A microcontroller that is embedded in the integrated circuit is booted up. A reset control signal is sent to reset an analog circuit in the integrated circuit, and a response signal for the analog circuit is monitored by the microcontroller. Based on the response signal, a calibration parameter for the analog circuit is determined, and the analog circuit is 10 configured using the calibration parameter. Other embodiments, aspects and features are also disclosed.

20 Claims, 10 Drawing Sheets

(56) References Cited

U.S. PATENT DOCUMENTS

| | | | |
|---|---|---|---|
| 6,523,101 B1* | 2/2003 | Nakata | G06F 8/61 |
| | | | 711/103 |
| 6,839,013 B1* | 1/2005 | Cummins | G06F 11/3656 |
| | | | 341/120 |
| 7,541,857 B1 | 6/2009 | Wong et al. | |
| 8,125,360 B1 | 2/2012 | Kutz et al. | |
| 2005/0197795 A1 | 9/2005 | Kas et al. | |
| 2005/0242980 A1* | 11/2005 | Collins | G01R 31/31855 |
| | | | 341/155 |
| 2005/0261821 A1* | 11/2005 | Abe | F02D 41/266 |
| | | | 701/111 |
| 2006/0101398 A1* | 5/2006 | Schepers | G06F 11/362 |
| | | | 717/120 |
| 2007/0250282 A1 | 10/2007 | Hsu | |
| 2009/0199166 A1* | 8/2009 | Sakata | G06F 8/443 |
| | | | 717/136 |
| 2009/0315617 A1 | 12/2009 | Rosik et al. | |
| 2010/0031012 A1* | 2/2010 | Rotondo | G06F 21/00 |
| | | | 713/2 |
| 2010/0176976 A1 | 7/2010 | Breems et al. | |
| 2010/0223602 A1* | 9/2010 | Kreek | G06F 8/64 |
| | | | 717/140 |
| 2013/0049797 A1 | 2/2013 | Singh et al. | |
| 2013/0176154 A1 | 7/2013 | Bonaccio et al. | |

OTHER PUBLICATIONS

ALTERA DesignCon 2009—Method and Apparatus of Continuous PLL Adaptation to Variable Reference Input Frequency, Feb. 2009, 12 sheets.

ALTERA DesignCon 2010—Offset Cancellation in Receiver Path in 45-nm 6.5-Gbps Transceiver FPGAs, Jan. 2010, 9 sheets.

Board Affirmed Decision on Appeal for U.S. Appl. No. 13/466,555, dated Feb. 9, 2018, 7 pages.

The extended European search Report for Application No. EP 13161758.1, 4 sheets, dated Apr. 16, 2014 (dated Apr. 16, 2014).

Examiner's Answer to Appeal Brief for U.S. Appl. No. 13/466,555, dated May 6, 2016, 16 pages.

Final Office Action for U.S. Appl. No. 13/446,555, dated Jul. 28, 2015, 19 pages.

First Office Action for U.S. Appl. No. 13/446,555, dated Jan. 28, 2015, 19 pages.

Restriction Requirement for U.S. Appl. No. 13/446,555, dated Apr. 24, 2013, 6 pages.

* cited by examiner

APPARATUS AND METHODS FOR CALIBRATING ANALOG CIRCUITRY IN AN INTEGRATED CIRCUIT

PRIORITY CLAIM

The present application is a divisional of, and claims the benefit of priority of, U.S. patent application Ser. No. 13/446,555, filed Apr. 13, 2012.

BACKGROUND

Technical Field

The present invention relates generally to integrated circuits, and more particularly to the calibration of analog circuitry on integrated circuits.

Description of the Background Art

As semiconductor process densities shrink, there is an increasing number of different transistor level chip-to-chip and on-die variations. Analog circuits, such as differential receive input buffers, for example, are very susceptible to such process variations.

To compensate for such process variations, integrated circuits may be manufactured with features to tune settings of analog circuits so as to be able to compensate for these variations. The tuning may be accomplished using calibration procedures that may be implemented as dedicated circuitry that is either hard-wired in the integrated circuit or configured into a programmable core of the integrated circuit.

SUMMARY

The present disclosure provides apparatus and methods for the calibration of analog circuitry on an integrated circuit.

One embodiment relates to a method of calibrating analog circuitry within an integrated circuit. A microcontroller that is embedded in the integrated circuit is booted up. A reset control signal is sent to reset an analog circuit in the integrated circuit, and a response signal for the analog circuit is monitored by the microcontroller. Based on the response signal, a calibration parameter for the analog circuit is determined, and the analog circuit is configured using the calibration parameter.

Another embodiment relates to an integrated circuit including a core, a microcontroller that is embedded in the integrated circuit, a plurality of sub-modules that include analog circuitry, and a communication system arranged to communicatively interconnect the microcontroller with the plurality of sub-modules for calibration of the analog circuitry.

Another embodiment relates to a system for calibrating analog circuitry within an integrated circuit. The system includes a core of the integrated circuit, a microcontroller that is embedded in the integrated circuit, a plurality of sub-modules that include the analog circuitry, and a communication system arranged to communicatively interconnect the microcontroller with the plurality of sub-modules for calibration of the analog circuitry. The system further includes a tangible non-transitory storage medium for storing boot code for the microcontroller.

Another embodiment relates to a programmable logic device. The programmable logic device includes a programmable logic array, a plurality of transceiver circuits, a microcontroller including a processing unit and memory, and a communication system. The communication system is arranged to communicatively interconnect the microcontroller with the plurality of transceiver circuits for calibration of analog circuits therein.

Other embodiments, aspects, and features are also disclosed.

DETAILED DESCRIPTION

As described above, existing approaches to calibrating analog circuits in an integrated circuit use calibration procedures that are implemented as dedicated circuitry that is either hard-wired in the integrated circuit or electronically-configured into a programmable core of the integrated circuit. These existing approaches have certain drawbacks and limitations.

Implementing the calibration procedures as hard-wired circuitry in the integrated circuit has the advantage of being fast in that it is brought up in a short amount of time. However, the hard-wired circuitry suffers from the drawback of being inflexible and requiring knowledge of the calibration algorithms prior to the tape-out. This is substantial drawback because it may take months of measurements across a large number of units to understand the silicon process variations and their effect on the analog circuits. There is also a risk of the calibration algorithms needing to be changed after tape-out.

Implementing the calibration procedures using programmable logic has the advantage of being flexible in that the calibration algorithms may be changed by modifying the electronically-programmed configuration of the programmable logic. However, this approach typically requires the programmable logic core of the integrated circuit to be programmed and ready before the analog circuitry is operational. This may impede requirements for a transceiver link bring-up time if the analog circuitry being calibrated is needed by the transceiver circuitry.

The present disclosure provides an innovative new architecture for calibrating analog circuits in an integrated circuit. An embedded calibration microcontroller is provided within the integrated circuit, and a common bus may be used to communicatively couple the microcontroller to circuit modules having analog circuitry to be calibrated.

Compared to the approach of hard-wiring the calibration procedure, the presently-disclosed approach is slightly slower because the procedure is performed by program code executed by the microcontroller. However, the presently-disclosed approach has a substantially lower risk of being unable to properly calibrate the analog circuits. This is because only the processor and certain peripheral interfaces are hard-wired, while the program code provides flexibility in changing or adjusting the calibration procedure.

Compared to the approach of configuring programmable logic with the calibration procedure, the presently-disclosed approach is substantially faster on the initial calibration. This is because the programmable core of the chip does not need to be configured prior to running the calibration procedure.

Figure 1:
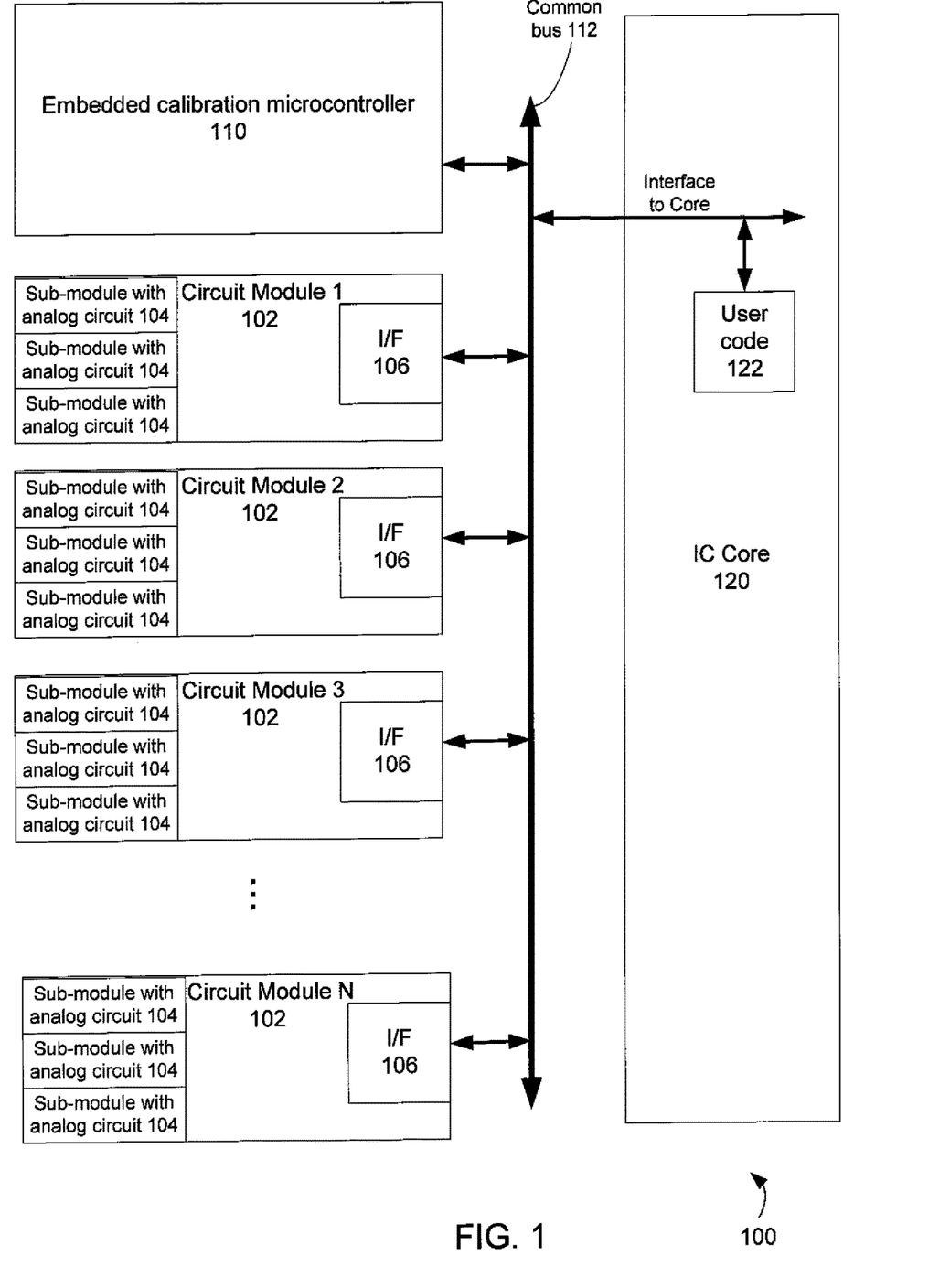
FIG. 1 shows an exemplary integrated circuit that includes an embedded calibration microcontroller and a common bus in accordance with an embodiment of the invention.

FIG. 1 shows an exemplary integrated circuit 100 that includes an embedded calibration microcontroller 110 and a common bus 112 in accordance with an embodiment of the invention. As depicted, the common bus 112 may be arranged to use multiple lines to communicatively interconnect the embedded calibration microcontroller (referred to herein as the microcontroller or the "ECµC") 110 with a plurality of circuit modules 102 via the interface (I/F) circuits 106. Each of the circuit modules may have analog circuitry within one or more sub-modules 104. In addition, the common bus 112 may be arranged to communicatively interconnect to an interface to a core 120 of the integrated circuit 100. The IC core 120 may include programmable circuitry and may be electronically configured to include user code 122. In an exemplary implementation, the common bus may implement an address based read/write interface and may have separate address, data and control lines.

Figure 2:
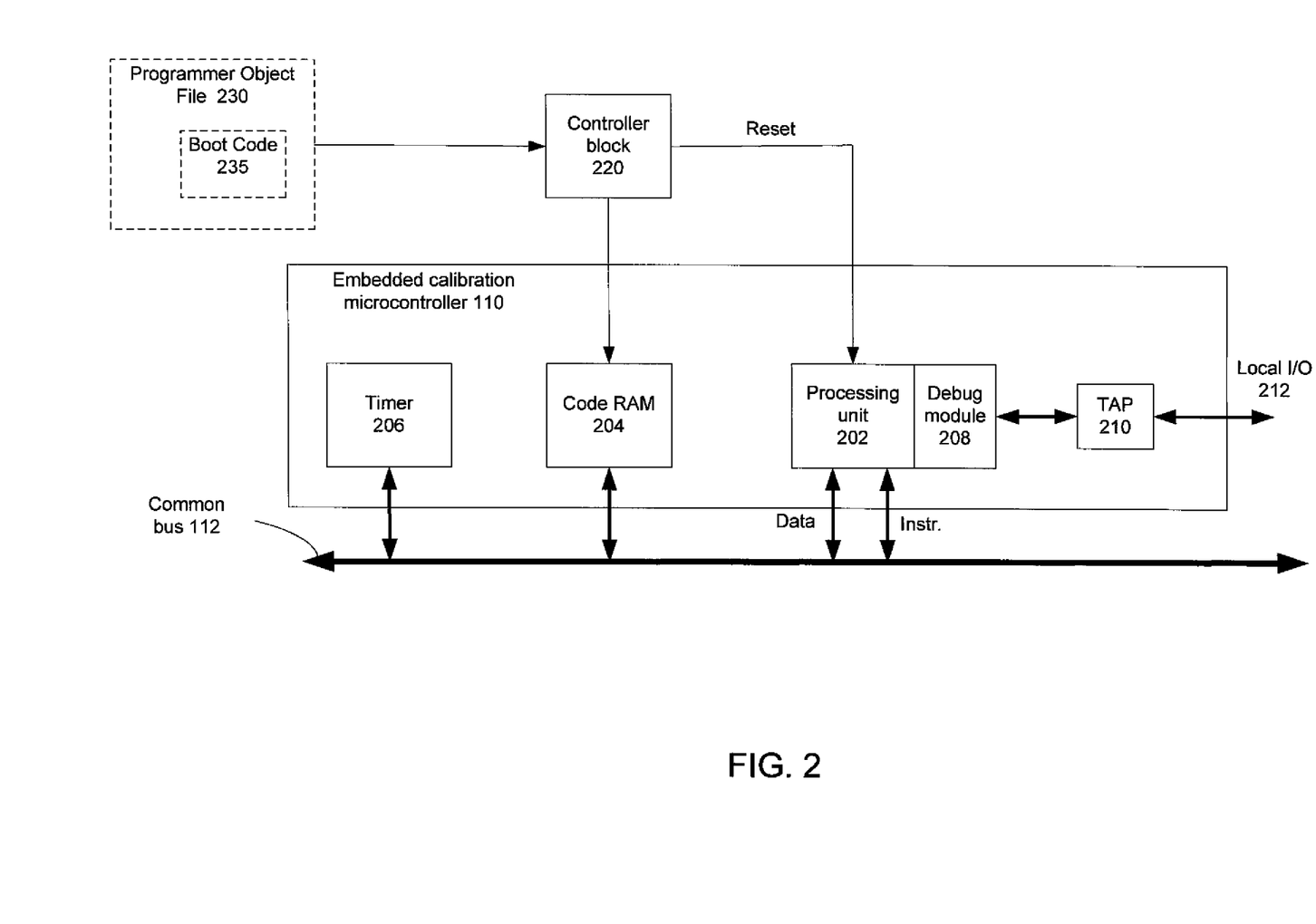
FIG. 2 depicts an exemplary embedded calibration microcontroller in accordance with an embodiment of the invention.

FIG. 2 depicts an exemplary embedded calibration microcontroller 110 in accordance with an embodiment of the invention. As shown, the microcontroller 110 may include a processing unit 202, memory for storing and accessing code (code memory) 204, and timer circuitry 206. In an exemplary implementation, the processing unit 202 may comprise an ARM® (Advanced RISC Machine) core, and the code memory 204 may comprise random access memory (RAM) for rapid access to the code. The timer circuitry 206 may be arranged to provide timing signals for an intra-chip communication system, such as, for example, the common bus 112.

The microcontroller 110 may also include a debug module 208 which may utilize boundary scan technology for debugging the processing unit 202. In an exemplary implementation, the debug module 208 may implement a JTAG (Joint Test Action Group) boundary scan test system. A test access port (TAP) 210 may be arranged to interface to the debug module 208. The TAP 210 may be accessed via a local input/output interface 212.

In an exemplary implementation, a controller block 220 on the integrated circuit 100 may be arranged to receive or download boot code 235 from a programmer object file 230. The boot code 235 may be stored by the controller block 220 into the code memory 204 of the microcontroller 110. The controller block 220 may be further arranged to send a reset signal to the processing unit 202. Upon being reset, the processing unit 202 may then execute the boot code 235 in the code memory 204.

Figure 3:
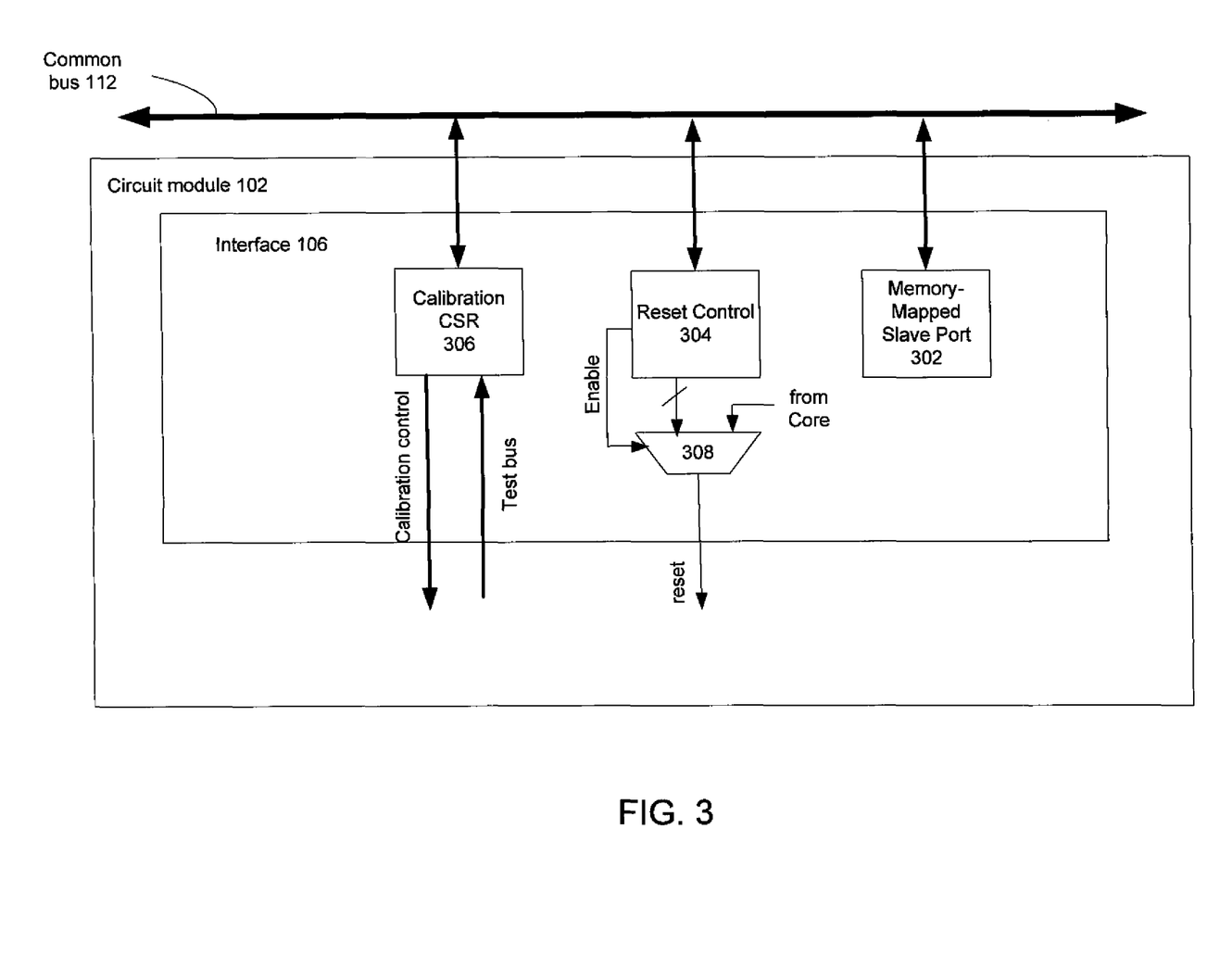
FIG. 3 depicts an exemplary interface to a circuit module having analog circuitry to be calibrated in accordance with an embodiment of the invention.

FIG. 3 depicts an exemplary interface 106 to a circuit module 102 having analog circuitry to be calibrated in accordance with an embodiment of the invention. As shown, the interface 106 may include a memory-mapped port 302, a reset control circuit 304, and a calibration configuration shift register (calibration CSR) 306.

The memory-mapped slave port 302 may be arranged to enable addressing of a particular circuit module 102 amongst the N circuit modules 102. The memory-mapped slave port 302 may be further arranged to provide for addressing of a particular sub-module 104 within a circuit module 102. In an exemplary implementation, each of the sub-modules 104 may be a physical media attachment (PMA) module for a serial data channel, and each circuit module 102 may include a triplet of three such PMA modules.

The reset control circuit 304 may be arranged to receive reset control signals from the microcontroller 110 by way of the common bus 112. The reset control circuit 304 may be further arranged to send reset control signals to a selector circuit 308. The selector circuit 308 may also receive reset control signals from the IC core 120. The selector circuit 308 may be controlled by an enable signal from the reset control circuit 304. For example, if the enable signal is high, then the selector circuit 308 may output the reset control signals from the reset control circuit 308, and if the enable signal is low, then the selector circuit may output the reset control signals from the IC core 120.

The calibration CSR 306 may be arranged to receive calibration control signals from the microcontroller 110 via the common bus 112 and send calibration control signals to the analog circuits to be calibrated within the circuit module 102. The calibration CSR 306 may be further arranged to receive test data signals from the sub-module 104 containing an analog circuit being calibrated and send the test data signals to the microcontroller 110 via the common bus 112.

FIGS. 4A, 4B, 5A and 5B are flow charts of exemplary methods (400, 450, 500, and 550, respectively) of initially calibrating a plurality of analog circuits on an integrated circuit in accordance with embodiments of the invention. The plurality of analog circuits to be calibrated by these methods may be a subset or all of the analog circuits on an integrated circuit. The plurality of analog circuits to be calibrated may be pre-set during the design of the integrated circuit or may be configurable by a user of the integrated circuit. Furthermore, the plurality of analog circuits may be of a same type of analog circuit or may include multiple different types of analog circuits.

Figure 4A:
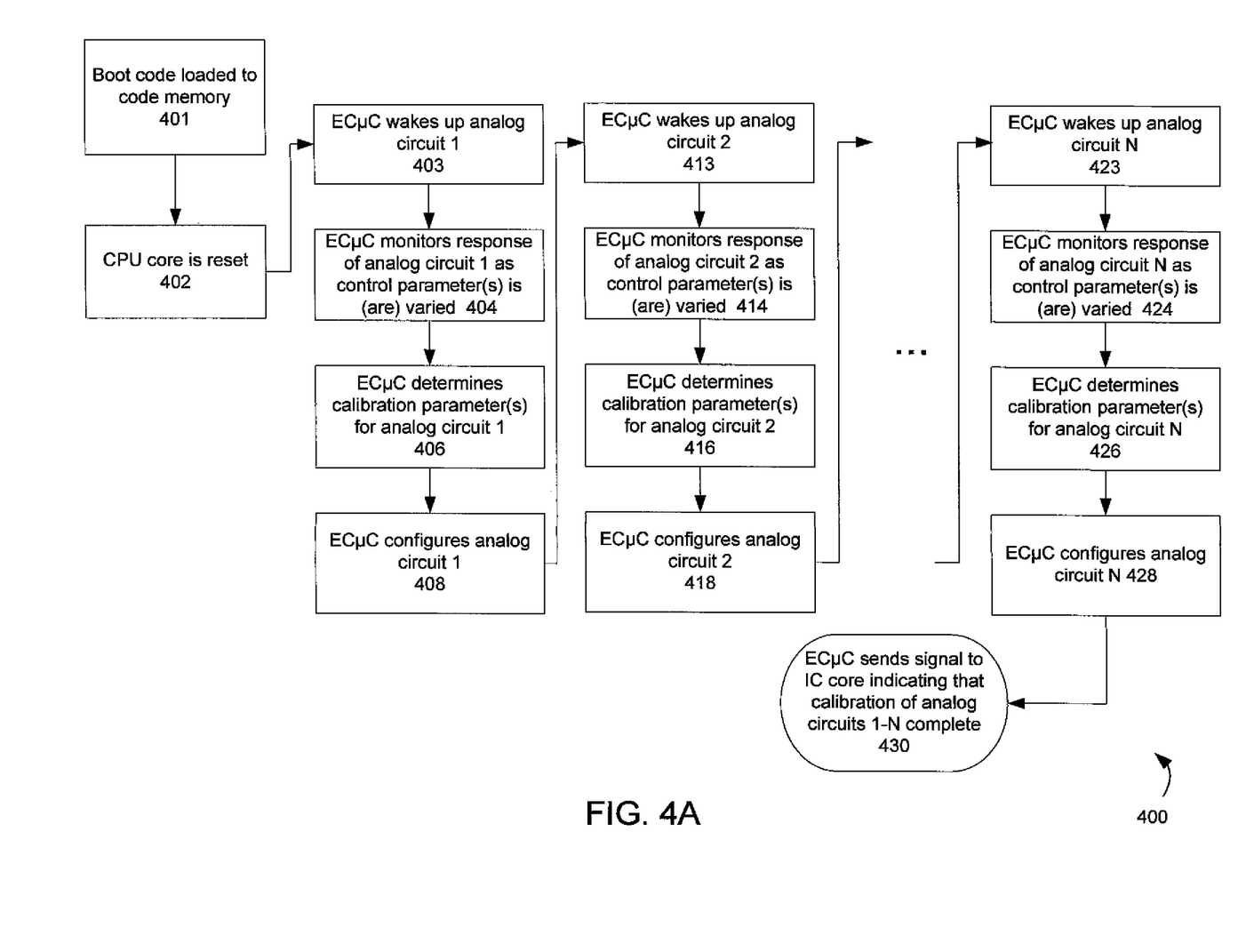
FIG. 4A is a flow chart of a first exemplary serial method of initially calibrating a plurality of analog circuits on an integrated circuit in accordance with an embodiment of the invention.

FIG. 4A is a flow chart of a first exemplary serial method 400 of initially calibrating a plurality of analog circuits on an integrated circuit in accordance with an embodiment of the invention. The method 400 calibrates the plurality of analog circuits in a serial order. Blocks 403 through 430 of the method 400 may be performed by the embedded calibration microcontroller (ECµC) 110 executing instructions in the boot code 235. Per block 401, after the IC 100 is powered on, the controller block 220 may download the boot code 235 from the programmer object file 230 to the code memory 204 of the ECµC 110. Per block 402, the controller block 220 may then send a reset signal to the processing unit 202 so that the ECµC 110 begins to execute the boot code 235.

Per block 403, the ECµC 110 may wake-up analog circuit 1 of a plurality of N analog circuits. This step may be performed by the ECµC 110 sending via the common bus 112 a reset control signal to the address associated with the sub-module 104 which includes analog circuit 1.

Per block 404, the ECµC 110 may monitor a response signal of analog circuit 1 as a control parameter is varied. This step may be performed by the ECµC 110 receiving test data signals (in this case, the response signal) via the common bus 112. The test data signals may originate from the sub-module 104 which includes analog circuit 1. For example, if analog circuit 1 is a phase detector, then the test data signals may be the output signals of the phase detector as its offset is varied. The offset may be varied under control of the calibration control signals. In one implementation, the calibration control signals may be sent from the ECµC 110 via a calibration CSR 306 to the phase detector being calibrated.

Per block 406, the ECµC 110 may determine one or more calibration parameters for the analog circuit 1. The determination may be performed by processing or analyzing the test data signals received while monitoring the output of analog circuit 1. For example, if analog circuit 1 is a phase detector, then the output signals of the phase detector as a function of the offset may be processed by an analysis procedure executed by the ECµC 110. The analysis procedure may check for the unstable state region of the phase detector to determine the amount of offset cancellation that is needed.

Per block 408, the ECµC 110 may then configure analog circuit 1. The configuration of analog circuit 1 may be performed using the one or more calibration parameters determined per block 406. For example, if analog circuit 1 is a phase detector, then the phase detector may be configured with an offset cancellation that was determined using the analysis procedure executed by the ECµC 110. The offset cancellation may be applied to the phase detector by sending appropriate control calibration signals.

At this point in the method 400, analog circuit 1 has been calibrated, and the method 400 moves on to calibrate a next analog circuit. Per block 413, the ECµC 110 may wake-up another of the analog circuits, e.g., analog circuit 2 of the plurality of N analog circuits. This step may be performed by the ECµC 110 sending via the common bus 112 a reset control signal to the address associated with the sub-module 104 which includes analog circuit 2.

Per block 414, the ECµC 110 may monitor the output of analog circuit 2 as a control parameter is varied. This step may be performed by the ECµC 110 receiving test data signals (in this case, the response signal) via the common bus 112. The test data signals may originate from the sub-module 104 which includes analog circuit 2. For example, if analog circuit 2 is a phase detector, then the test data signals may be the output signals of the phase detector as its offset is varied. The offset may be varied under control of the calibration control signals. In one implementation, the calibration control signals may be sent from the ECµC 110 via a calibration CSR 306 to the phase detector being calibrated.

Per block 416, the ECµC 110 may determine one or more calibration parameters for the analog circuit 2. The determination may be performed by processing or analyzing the test data signals received while monitoring the output of analog circuit 2. For example, if analog circuit 2 is a phase detector, then the output signals of the phase detector as a function of the offset may be processed by an analysis procedure executed by the ECµC 110. The analysis procedure may check for the unstable state region of the phase detector to determine the amount of offset cancellation that is needed.

Per block 418, the ECµC 110 may then configure analog circuit 2. The configuration of analog circuit 2 may be performed using the one or more calibration parameters determined per block 416. For example, if analog circuit 2 is a phase detector, then the phase detector may be configured with an offset cancellation that was determined using the analysis procedure executed by the ECµC 110. The offset cancellation may be applied to the phase detector by sending appropriate control calibration signals.

At this point in the method 400, analog circuit 2 has been calibrated, and the method 400 moves on to calibrate a next analog circuit. As indicated in FIG. 4A, the steps corresponding to blocks 413 through 418 are then performed for each subsequent analog circuit, as desired, for example in the series of analog circuits until analog circuit N is reached. In other words, the steps corresponding to blocks 413 through 418 are then performed for analog circuits 3 through N−1. The flow chart resumes at block 423. It is appreciated that the calibration of analog circuits may be performed in any order and that even some analog circuits may not be calibrated on purpose. As such, calibration of the analog circuits in series is exemplary and not intended to limit the scope of the present invention.

Per block 423, the ECµC 110 may wake-up analog circuit N which is the last of the plurality of N analog circuits. This step may be performed by the ECµC 110 sending via the common bus 112 a reset control signal to the address associated with the sub-module 104 which includes analog circuit N.

Per block 424, the ECµC 110 may monitor the output of analog circuit N as a control parameter is varied. This step may be performed by the ECµC 110 receiving test data signals (in this case, the response signal) via the common bus 112. The test data signals may originate from the sub-module 104 which includes analog circuit N. For example, if analog circuit N is a phase detector, then the test data signals may be the output signals of the phase detector as its offset is varied. The offset may be varied under control of the calibration control signals. In one implementation, the calibration control signals may be sent from the ECµC 110 via a calibration CSR 306 to the phase detector being calibrated.

Per block 426, the ECµC 110 may determine one or more calibration parameters for the analog circuit N. The determination may be performed by processing or analyzing the test data signals received while monitoring the output of analog circuit N. For example, if analog circuit N is a phase detector, then the phase detector may be configured with an offset cancellation that was determined using the analysis procedure executed by the ECµC 110. The offset cancellation may be applied to the phase detector by sending appropriate control calibration signals.

Per block 428, the ECµC 110 may then configure analog circuit N. The configuration of analog circuit N may be performed using the one or more calibration parameters determined per block 426. For example, if analog circuit N is a phase detector, then the phase detector may be configured with an offset cancellation that was determined using the analysis procedure executed by the ECμC 110. The offset cancellation may be applied to the phase detector by sending appropriate control calibration signals.

At this point in the method 400, analog circuits 1 through N have been calibrated, and the method 400 moves on to block 430. Per block 430, the ECμC 110 may send or communicate a signal to the IC core 120 indicating that calibration of analog circuits 1 through N has been completed.

Alternatively, instead of sending the indication per block 430 after calibration of all the analog circuits 1 through N is complete, an indication may be sent or communicated from the ECμC 110 to the IC core 120 after each individual analog circuit is calibrated. Such an alternate serial method 450 is depicted in FIG. 4B.

Figure 4B:
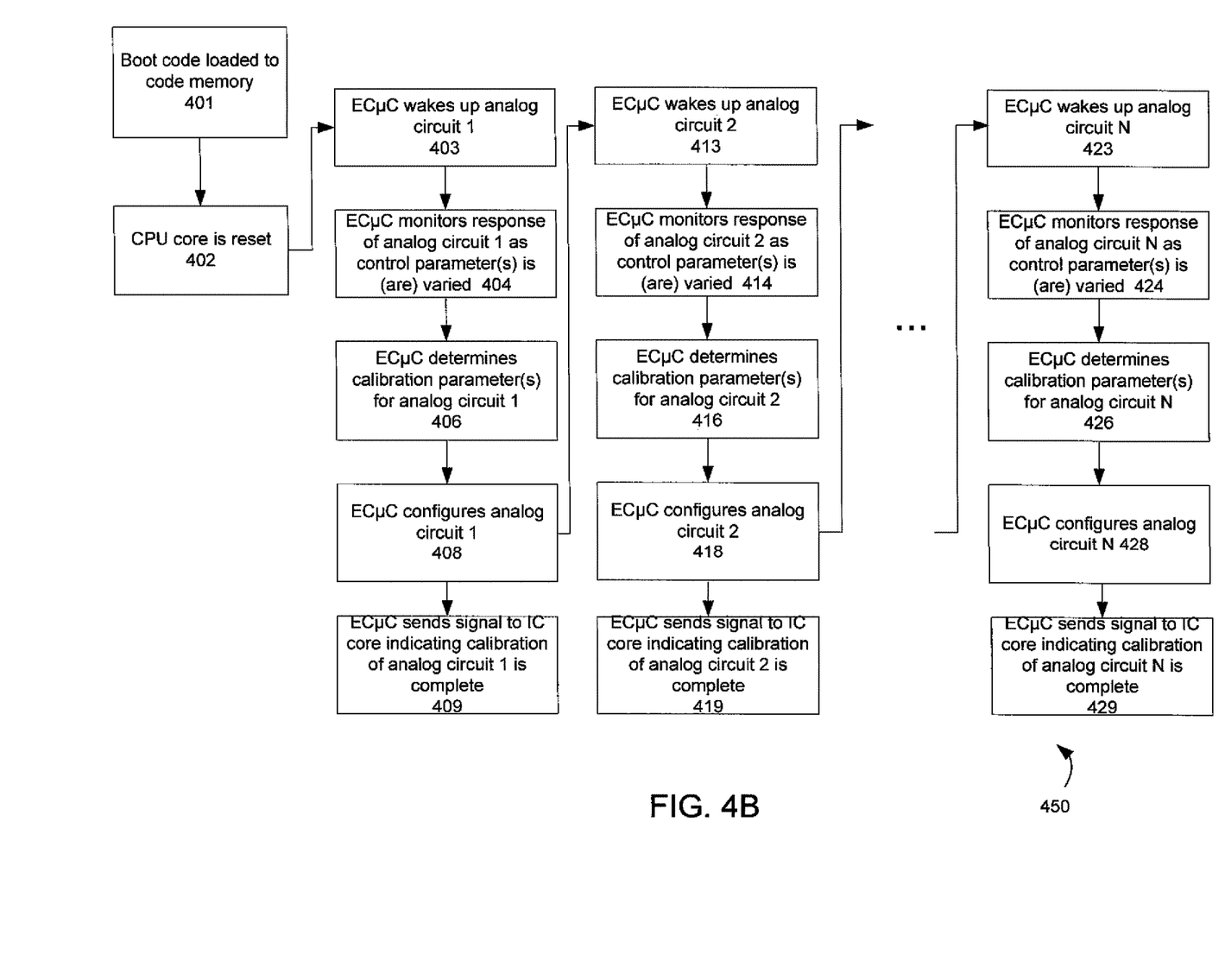
FIG. 4B is a flow chart of a second exemplary serial method of initially calibrating a plurality of analog circuits on an integrated circuit in accordance with an embodiment of the invention.

In comparison to the serial method 400 of FIG. 4A, the serial method 450 of FIG. 4B includes new blocks 409, 419, and 429. Per block 409, the ECμC 110 may send a signal to the IC core 120 that the calibration of analog circuit 1 is complete after the calibration of analog circuit 1 is done per block 408. Per block 419, the ECμC 110 may send a signal to the IC core 120 that the calibration of analog circuit 2 is complete after the calibration of analog circuit 2 is done per block 418. Corresponding signals may also be sent from the ECμC 110 to the IC core 120 after the calibration of analog circuits 3 through N−1. Finally, per block 429, the ECμC 110 may send a signal to the IC core 120 that the calibration of analog circuit N is complete after the calibration of analog circuit N is done per block 428. Blocks 403 through 429 of the method 450 may be performed by the ECμC 110 executing instructions in the boot code 235.

Figure 5A:
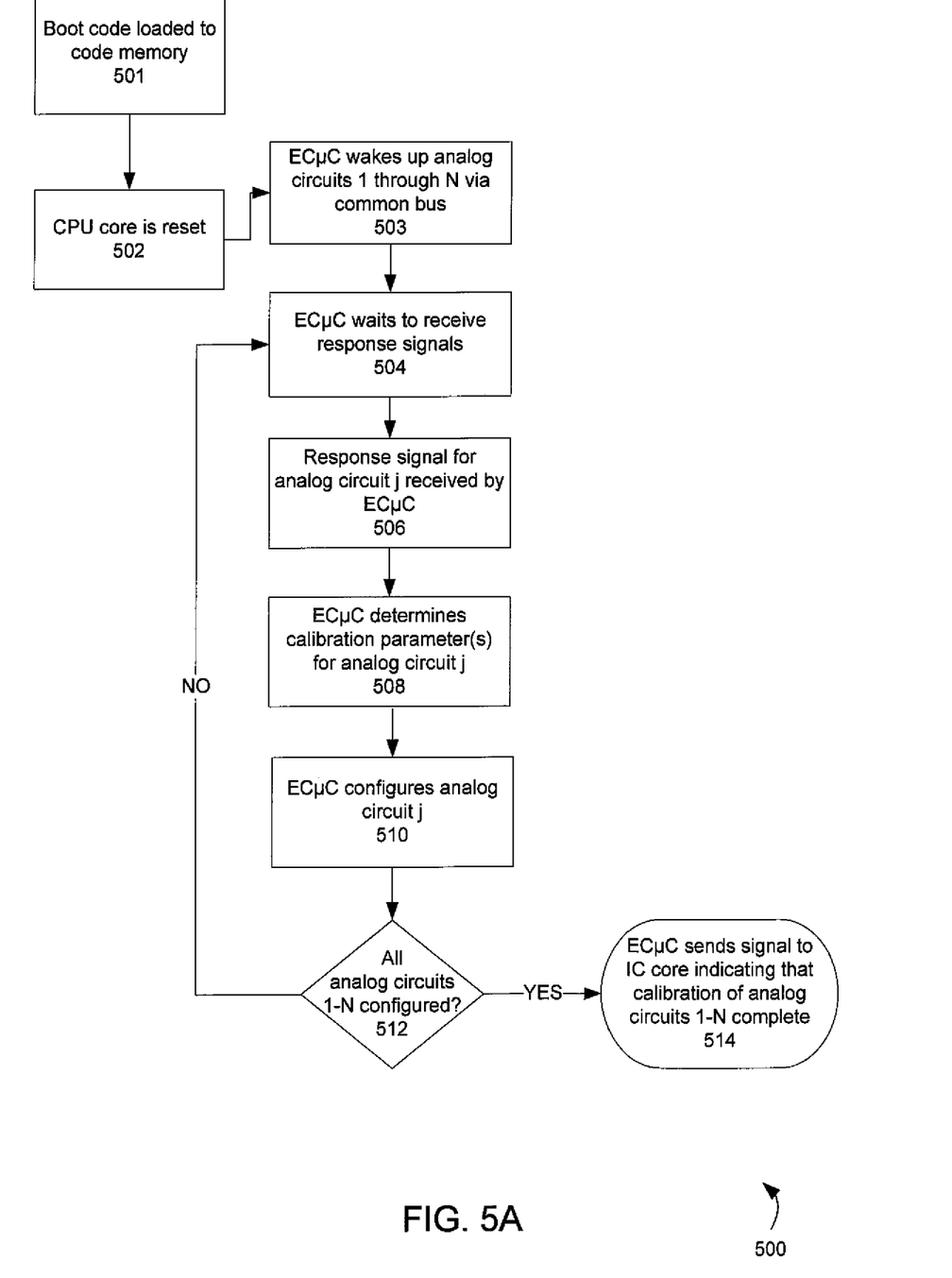
FIG. 5A is a flow chart of a first exemplary parallel method of initially calibrating a plurality of analog circuits on an integrated circuit in accordance with an embodiment of the invention.

FIG. 5A is a flow chart of a first exemplary parallel method 500 of initially calibrating a plurality of analog circuits on an integrated circuit in accordance with an embodiment of the invention. The method 500 allows for the calibration processes for the plurality of analog circuits to proceed in a parallel manner. Blocks 503 through 514 of the method 500 may be performed by the embedded calibration microcontroller (ECμC) 110 executing instructions in the boot code 235.

Per block 501, after the IC 100 is powered on, the controller block 220 may download the boot code 235 from the programmer object file 230 to the code memory 204 of the ECμC 110. Per block 502, the controller block 220 may then send a reset signal to the processing unit 202 so that the ECμC 110 begins to execute the boot code 235.

Per block 503, the ECμC 110 may wake-up sub-modules 104 which include analog circuits 1 through N of a plurality of N analog circuits. This step may be performed by the ECμC 110 sending via the common bus 112 a reset control signal to all the addresses associated with the sub-modules 104 which include analog circuits 1 through N.

Per block 504, the ECμC 110 waits to receive response signals. While the ECμC 110 is waiting, a calibration-related process may be performed at the sub-modules 104 which include the analog circuits being calibrated. For example, if the calibration involves voltage controlled oscillator (VCO) tuning, then the calibration related process may be tuning each VCO to a desired receiving or transmitting frequency.

Per block 506, a response signal from an individual sub-module 104 including analog circuit j may be received by the ECμC 110. For example, the response signal may be transmitted from the calibration CSR 306 of the interface 106 of the sub-module 104 for the analog circuit j to the ECμC 110 via the common bus 112. The response signal may provide calibration information for an individual analog circuit j. For example, if the calibration involves VCO tuning, then the calibration information may indicate the control voltage (Vctrl) at which a frequency lock was accomplished during the calibration-related process at the individual VCO j. In some implementations, such a frequency lock may take on the order of ten milliseconds to accomplish.

Per block 508, the ECμC 110 may then determine one or more calibration parameters for the analog circuit j. The determination may use the calibration information received per block 506. For example, if the calibration involves VCO tuning, then the ECμC 110 may use the received Vctrl to determine a gear setting for the individual VCO j.

Per block 510, the ECμC 110 may then configure the analog circuit j. The configuration of analog circuit j may be performed at the sub-module 104 that includes the analog circuit j using the one or more calibration parameters determined per block 508.

Per block 512, a determination may be made as to whether all the analog circuits 1 through N to be configured have been configured. If not all the N analog circuits to be configured have been configured, then the method 500 may loop back to block 504 and wait to receive further responses. If all the N analog circuits to be configured have been configured, then the method 500 may move on to block 514. Per block 514, the ECμC 110 may send a signal to the IC core 120 indicating that calibration of the sub-modules 104 including analog circuits 1 through N has been completed.

Alternatively, instead of sending the indication per block 514 after calibration of all the N analog circuits to be configured is complete, an indication may be sent from the ECμC 110 to the IC core 120 after each individual analog circuit of the N analog circuits is calibrated. Such an alternate parallel method 550 is depicted in FIG. 5B.

Figure 5B:
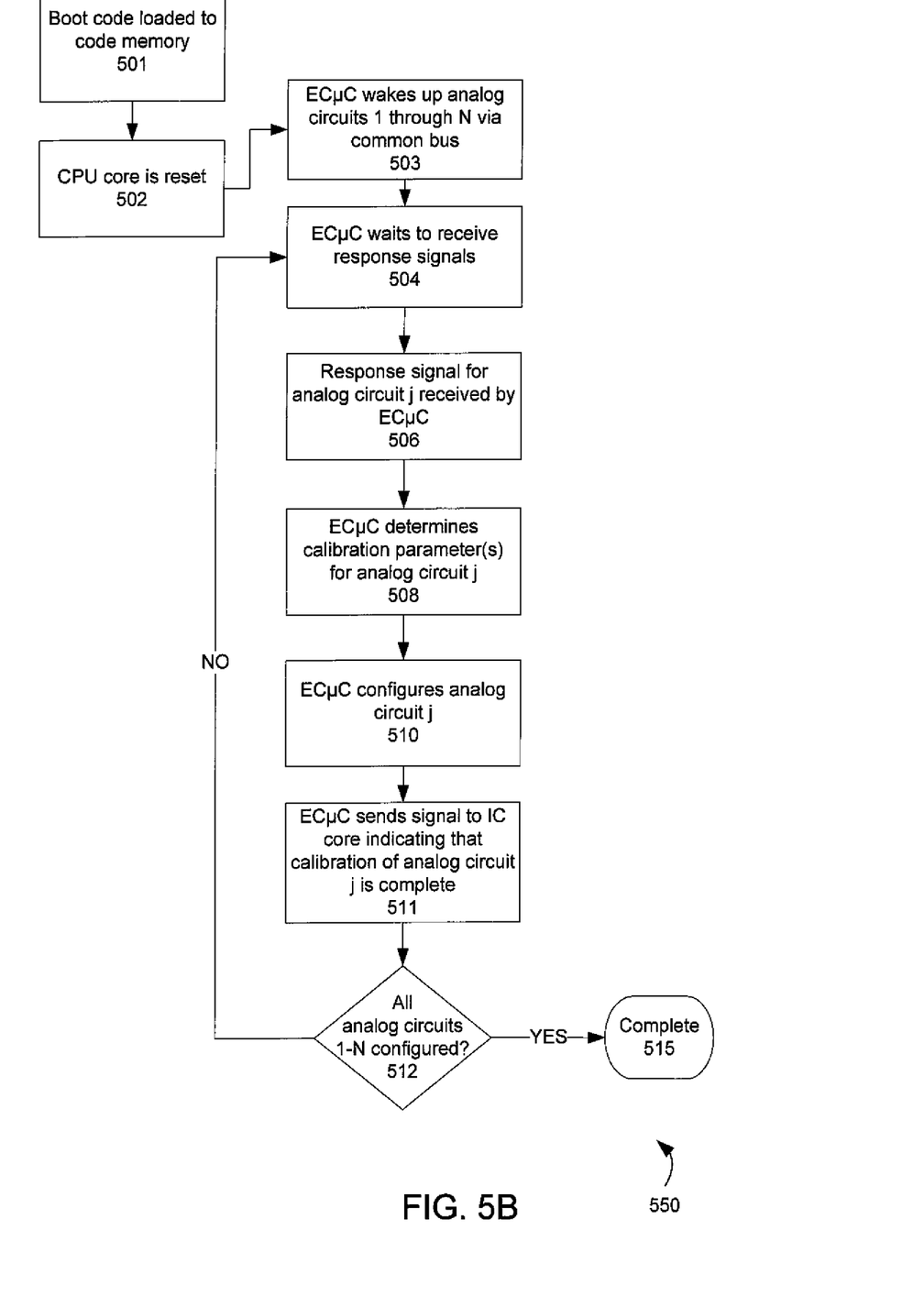
FIG. 5B is a flow chart of a second exemplary parallel method of initially calibrating a plurality of analog circuits on an integrated circuit in accordance with an embodiment of the invention.

Blocks 503 through 515 of the method 550 of FIG. 5B may be performed by the ECμC 110 executing instructions in the boot code 235. In the method 550 of FIG. 5B, block 514 of FIG. 5A is effectively replaced by block 511. Per block 511, the ECμC 110 may send a signal to the IC core 120 that the calibration of analog circuit j is complete after the calibration of analog circuit j is done per block 508. In addition, since the IC core 120 is signaled after the calibration of each analog circuit is finished, once it is determined that all analog circuits 1-N have been configured per block 512, then the method 550 may be considered complete per block 515.

Figure 6:
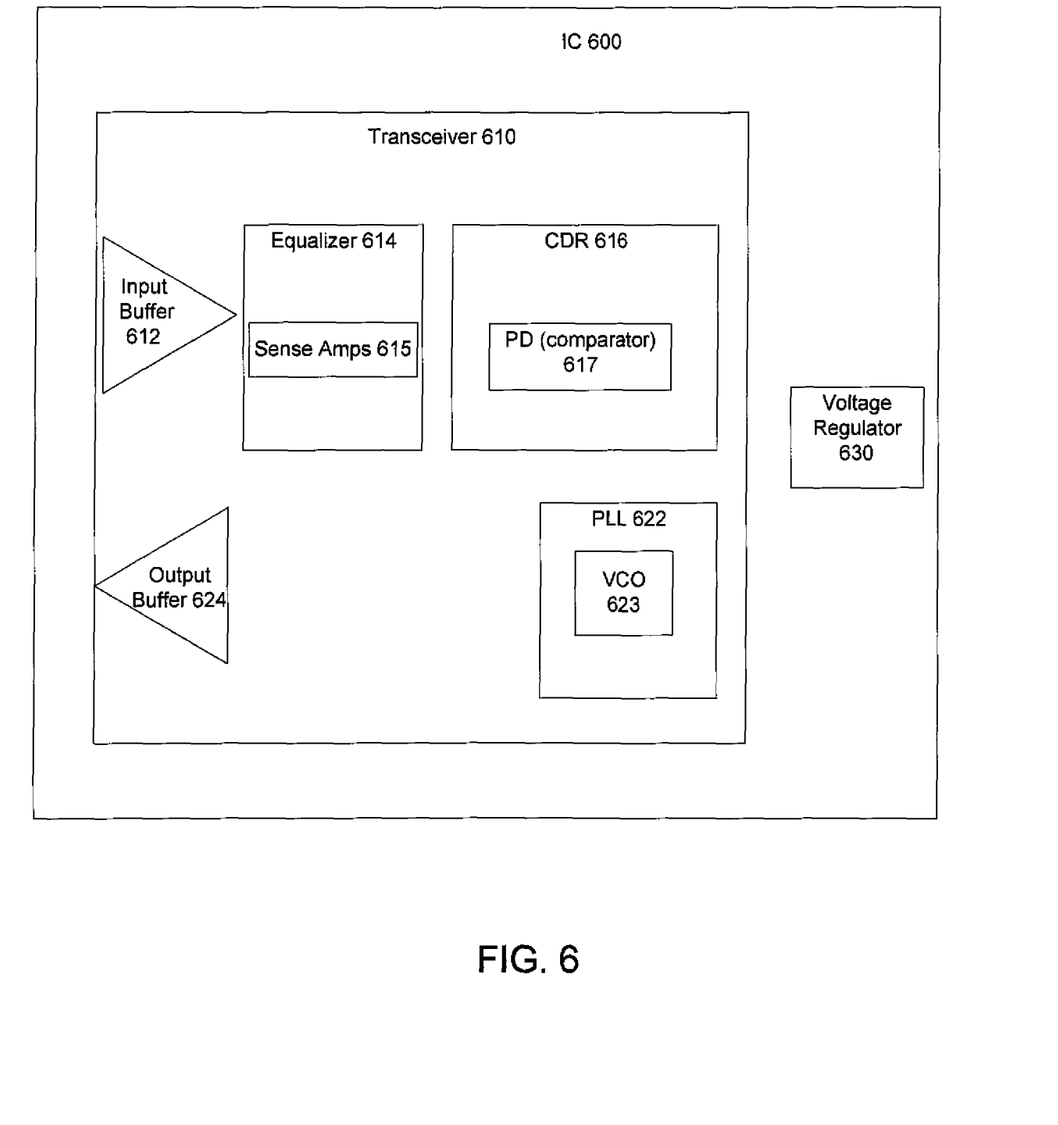
FIG. 6 depicts exemplary analog circuits to be calibrated on an integrated circuit in accordance with an embodiment of the invention.

FIG. 6 depicts exemplary analog circuits that may be calibrated on an integrated circuit 600 in accordance with an embodiment of the invention. As shown, the integrated circuit 600 may include, for example, one or more transceivers 610. Each transceiver may include, in its receiver path, input buffer 612, equalizer 614, and clock-and-data recovery (CDR) circuit 616. Each transceiver may also include one or more phase-locked loop (PLL) circuits 622 and an output buffer (transmitter driver) circuit 624. One or more voltage regulators 630 may also be included within the integrated circuit 600.

Each of the depicted components may include at least one analog circuit that may be calibrated by an embedded calibration microcontroller in accordance with an embodiment of the invention. For example, the CDR circuit 616 may include a phase detector (PD) 617 (which is a comparator), and the phase-locked loop 622 may include a voltage-controlled oscillator (VCO) 623. The offsets for multiple phase detectors on an integrated circuit may be calibrated, for example, using a serial method such as one of the methods (400 and 450) described above in relation to FIGS. 4A and 4B. Multiple VCOs may be tuned, for example, using a parallel method such as one of the methods (500 and 550) described above in relation to FIGS. 5A and 5B.

In addition, the equalizer 614 may include one or more sense amplifiers 615. The sense amplifiers 615 include analog circuitry and may be calibrated for offset correction. Multiple sense amplifiers 615 may be calibrated, for example, using a serial method such as one of the methods (400 and 450) described above in relation to FIGS. 4A and 4B.

The output buffer circuit 624 also includes analog circuitry and may be calibrated so as to reduce skew and duty cycle distortion from its output signal. Multiple output buffer circuits 624 may be calibrated, for example, using a parallel method such as one of the methods (500 and 550) described above in relation to FIGS. 5A and 5B.

The voltage regulator 630 also includes analog circuitry and may be calibrated to adjust its output voltage level. Multiple voltage regulators 630 may be calibrated, for example, using a serial method such as one of the methods (400 and 450) described above in relation to FIGS. 4A and 4B.

It is contemplated that other analog circuits on an integrated circuit may be calibrated using the techniques disclosed herein. In general, such analog circuits may process or compare analog signals and may be used for various applications, including analog-to-digital conversion, signal filtering, and other control and signal processing applications.

Figure 7:
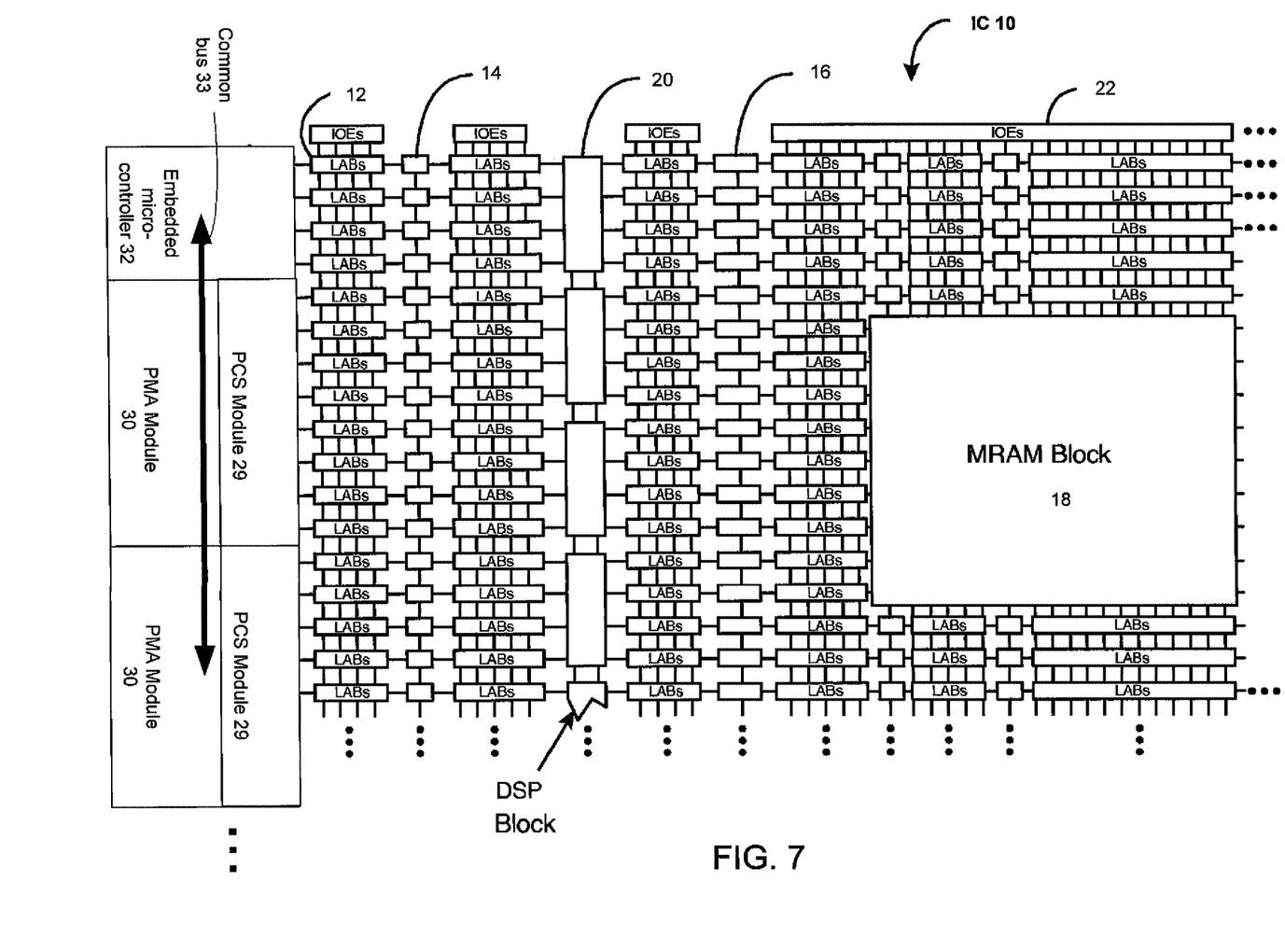
FIG. 7 is a simplified partial block diagram of an exemplary field programmable gate array that may be configured to implement an embodiment of the present invention.

FIG. 7 is a simplified partial block diagram of an exemplary field programmable gate array (FPGA) 10 that may be configured to implement an embodiment of the present invention. It is to be understood that FPGA 10 is described herein for illustrative purposes only and that the present invention can be implemented in many different types of integrated circuits, including FPGAs, programmable logic arrays (PLAs), other programmable logic devices (PLDs) including complex programmable logic devices (CPLDs), digital signal processors (DSPs), central processing units (CPUs), and application-specific integrated circuits (ASICs).

The FPGA 10 includes within its "core" a two-dimensional array of programmable logic array blocks (or LABS) 12 that are interconnected by a network of column and row interconnect conductors of varying length and speed. The LABs 12 include multiple (e.g., ten) logic elements (or LEs). A LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 10 may also include a distributed memory structure including random access memory (RAM) blocks of varying sizes provided throughout the array. The RAM blocks include, for example, blocks 14, blocks 16, and block 18. These memory blocks can also include shift registers and FIFO buffers.

FPGA 10 may further include digital signal processing (DSP) blocks 20 that can implement, for example, multipliers with add or subtract features. Input/output elements (IOEs) 22 located, in this example, around the periphery of the chip support numerous single-ended and differential input/output standards. Each IOE 22 is coupled to an external terminal (i.e., a pin) of FPGA 10.

Physical coding sublayer (PCS) 29 and physical medium attachment (PMA) 30 modules may be arranged as shown, for example, with each PCS module 29 being coupled to several LABs. Each PMA module 30 may be communicatively coupled to a corresponding PCS module 29 and may include analog (and digital) circuitry to implement one or more transceiver channels.

In accordance with an embodiment of the invention, the FPGA 10 may further include an embedded microcontroller 32 and a common bus 33. The common bus 33 is arranged to communicatively interconnect the embedded microcontroller 32 and the PMA modules 30. As described above, the embedded microcontroller 32 may be utilized to advantageously implement methods of calibrating the analog transceiver circuitry within the PMA modules 30.

It should be understood that embodiments of the present invention can be used in numerous types of integrated circuits such as, for example, FPGAs, PLAs, other PLDs including CPLDs, DSPs, CPUs and ASICs.

Figure 8:
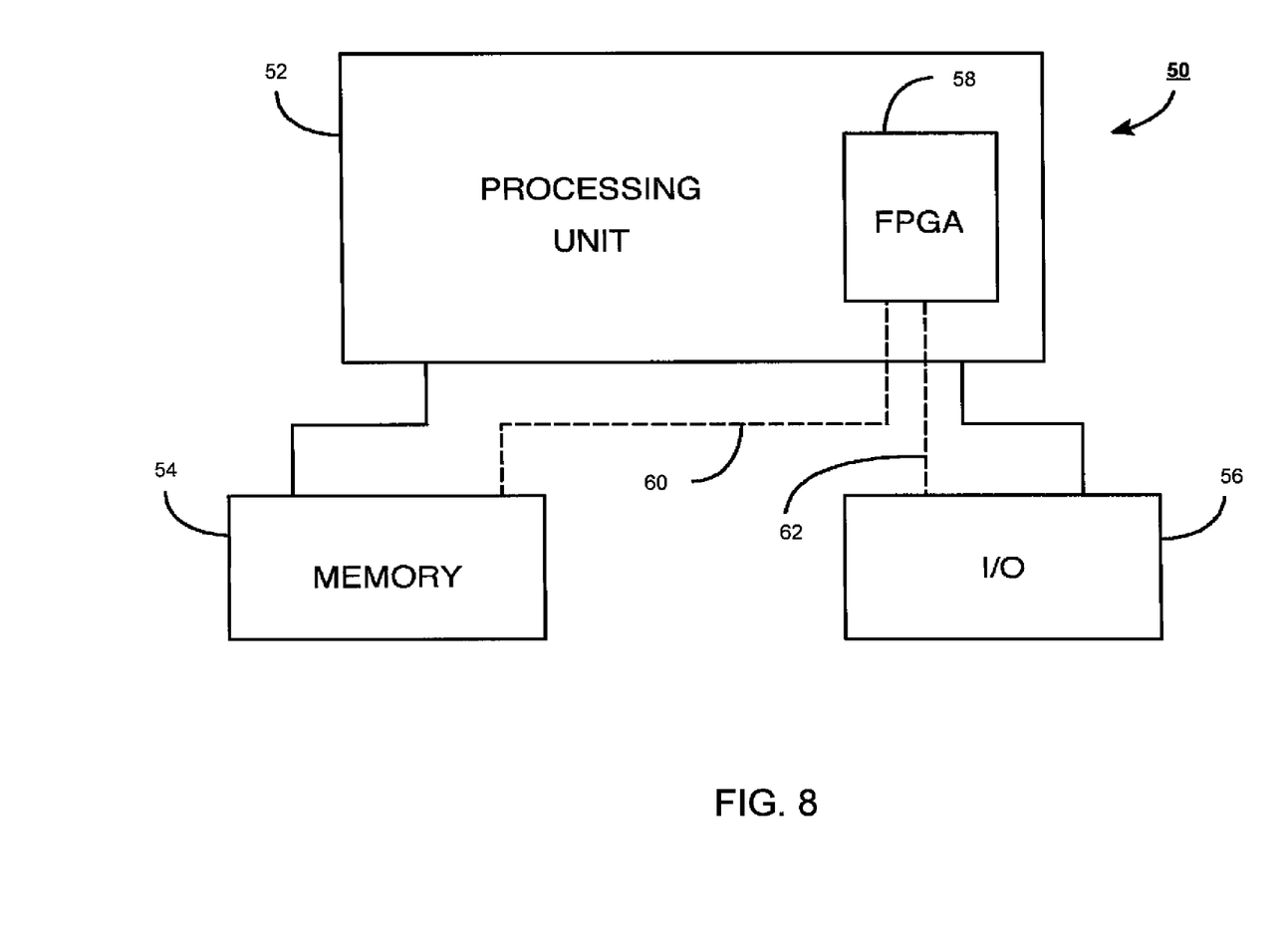
FIG. 8 shows a block diagram of an exemplary digital system that may employ techniques disclosed herein.

FIG. 8 shows a block diagram of an exemplary digital system 50 that may employ techniques disclosed herein. System 50 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 50 may be provided on a single board, on multiple boards, or within multiple enclosures.

System 50 includes a processing unit 52, a memory unit 54, and an input/output (I/O) unit 56 interconnected together by one or more buses. According to this exemplary embodiment, FPGA 58 is embedded in processing unit 52. FPGA 58 can serve many different purposes within the system 50. FPGA 58 can, for example, be a logical building block of processing unit 52, supporting its internal and external operations. FPGA 58 is programmed to implement the logical functions necessary to carry on its particular role in system operation. FPGA 58 can be specially coupled to memory 54 through connection 60 and to I/O unit 56 through connection 62.

Processing unit 52 may direct data to an appropriate system component for processing or storage, execute a program stored in memory 54, receive and transmit data via I/O unit 56, or other similar function. Processing unit 52 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 58 may control the logical operations of the system. As another example, FPGA 58 acts as a reconfigurable processor that may be reprogrammed as needed to handle a particular computing task. Alternately, FPGA 58 may itself include an embedded microprocessor. Memory unit 54 may be a random access memory (RAM), read only memory (ROM), fixed or flexible disk media, flash memory, tape, or any other storage means, or any combination of these storage means.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. An integrated circuit comprising:
   a core of the integrated circuit;
   a microcontroller that is embedded in the integrated circuit, the microcontroller including a processing unit and memory;
   a controller block arranged to receive boot code for the microcontroller from a programmer object file and store the boot code in the memory for the microcontroller;
   a plurality of sub-modules which include analog circuitry; and
   a common bus arranged to communicatively interconnect the microcontroller with the plurality of sub-modules for calibration of the analog circuitry.

2. The integrated circuit of claim 1 further comprising:
   interface circuitry arranged between the common bus and the plurality of sub-modules, wherein the interface circuitry includes a shift register to communicate test data from the plurality of sub-modules to the common bus, a shift register to communicate calibration control signals from the common bus to the plurality of sub-modules, and a reset control circuit to controllably reset an analog circuit within the sub-modules.

3. The integrated circuit of claim 2, wherein the interface circuitry further includes a memory-mapped port for addressing the plurality of sub-modules by way of the common bus.

4. The integrated circuit of claim 1 further comprising:
   a debug module arranged for debugging the processing unit using a boundary scan test system.

5. The integrated circuit of claim 1, wherein the core comprises a programmable logic array, and the analog circuitry within the plurality of submodules include circuits from a group of circuits consisting of comparators, phase detectors, sense amplifiers, and voltage regulators.

6. The integrated circuit of claim 1, wherein the microcontroller configures the analog circuitry in response to executing the boot code in the memory of the microcontroller.

7. The integrated circuit of claim 1, wherein the boot code comprises:
   computer-readable program instructions for sending a reset control signal to a sub-module of the plurality of sub-modules to reset an analog circuit in the sub-module;
   computer-readable program instructions for monitoring the communication system for a response signal from the sub-module;
   computer-readable program instructions for determining a calibration parameter for the analog circuit in the sub-module based on the response signal; and
   computer-readable program instructions for configuring the analog circuit in the sub-module using the calibration parameter.

8. The integrated circuit of claim 7, wherein the boot code further comprises:
   computer-readable program instructions for repeating the sending, monitoring, determining, and configuring for further sub-modules of the plurality of sub-modules; and
   computer-readable program instructions for communicating a signal from the microcontroller to the core of the integrated circuit, the signal indicating that calibration of the analog circuits in the plurality of sub-modules is complete.

9. The integrated circuit of claim 7, wherein the boot code further comprises:
   computer-readable program instructions for sending a reset control signal to the plurality of sub-modules such that calibration-related processes for the plurality of submodules proceed in parallel;
   computer-readable program instructions for waiting to receive response signals from the plurality of sub-modules, wherein a response signal for an individual submodule is received after an analog calibration-related process for the individual submodule is complete;
   computer-readable program instructions for configuring the individual submodule after the response signal from the individual sub-module is received;
   computer-readable program instructions for determining if all of the plurality of sub-modules have been configured; and
   computer-readable program instructions for waiting to receive further response signals if not all of the plurality of sub-modules have been configured.

10. The integrated circuit of claim 7, wherein the boot code further comprises:
    computer-readable program instructions for repeating the sending, monitoring, determining, and configuring for further sub-modules of the plurality of sub-modules.

11. The integrated circuit of claim 7, wherein the boot code further comprises:
    computer-readable program instructions for sending a reset control signal to the plurality of sub-modules such that calibration-related processes for the plurality of submodules proceed in parallel.

12. The integrated circuit of claim 1, wherein the core, the microcontroller, the plurality of sub-modules that includes the analog circuit, the communication system, and the controller block are implemented on a field programmable gate array.

13. A system for calibrating analog circuits within an integrated circuit, the system comprising:
    a microcontroller that is embedded in the integrated circuit, the microcontroller including a processing unit and memory;
    a plurality of sub-modules that includes the analog circuits therein; and
    a tangible non-transitory storage medium for storing boot code for the microcontroller, wherein the boot code is loaded to the memory of the microcontroller from a programmer object file in the tangible non-transitory storage medium, and wherein the microcontroller configures the analog circuits in response to executing the boot code in the memory of the microcontroller.

14. The system of claim 13 further comprising a communication system arranged to communicatively interconnect the microcontroller with the plurality of sub-modules for calibration of the analog circuits therein.

15. The system of claim 14, wherein the communication system comprises:
   a common bus arranged to communicatively interconnect the microcontroller with the plurality of sub-modules for calibration of the analog circuits; and
   interface circuitry arranged between the common bus and the plurality of submodules, wherein the interface circuitry includes a shift register to communicate test data from the plurality of sub-modules to the common bus, a shift register to communicate calibration control signals from the common bus to the plurality of sub-modules, and a reset control circuit to controllably reset an analog circuit within the sub-modules.

16. The system of claim 15, wherein the interface circuitry further includes a memory-mapped port for addressing the plurality of sub-modules by way of the common bus.

17. The system of claim 13, wherein the microcontroller, the plurality of sub-modules that includes the analog circuit, and the tangible non-transitory storage medium are implemented on a field programmable gate array.

18. The system of claim 13, wherein the boot code comprises:
   computer-readable program instructions for sending a reset control signal to a sub-module of the plurality of sub-modules to reset an analog circuit in the sub-module;
   computer-readable program instructions for monitoring the communication system for a response signal from the sub-module;
   computer-readable program instructions for determining a calibration parameter for the analog circuit in the sub-module based on the response signal; and
   computer-readable program instructions for configuring the analog circuit in the sub-module using the calibration parameter.

19. The system of claim 18, wherein the boot code further comprises:
   computer-readable program instructions for repeating the sending, monitoring, determining, and configuring for further sub-modules of the plurality of sub-modules; and
   computer-readable program instructions for communicating a signal from the microcontroller to the core of the integrated circuit, the signal indicating that calibration of the analog circuits in the plurality of sub-modules is complete.

20. The system of claim 18, wherein the boot code further comprises:
   computer-readable program instructions for sending a reset control signal to the plurality of sub-modules such that calibration-related processes for the plurality of submodules proceed in parallel;
   computer-readable program instructions for waiting to receive response signals from the plurality of sub-modules, wherein a response signal for an individual submodule is received after an analog calibration-related process for the individual submodule is complete;
   computer-readable program instructions for configuring the individual submodule after the response signal from the individual sub-module is received;
   computer-readable program instructions for determining if all of the plurality of sub-modules have been configured; and
   computer-readable program instructions for waiting to receive further response signals if not all of the plurality of sub-modules have been configured.

* * * * *